United States Patent [19]
Yao

[11] 3,987,478
[45] Oct. 19, 1976

[54] COMPOSITE TYPE SEMICONDUCTOR AND PREPARATION THEREOF

[75] Inventor: Toshio Yao, Itami, Japan

[73] Assignee: Mitsubishi Denki Kabushiki Kaisha, Tokyo, Japan

[22] Filed: Sept. 12, 1974

[21] Appl. No.: 505,374

[30] Foreign Application Priority Data
Sept. 19, 1973 Japan............................ 48-109697

[52] U.S. Cl.................................. 357/48; 357/44; 357/49; 357/86
[51] Int. Cl.².................. H01L 27/04; H01L 27/12; H01L 27/02
[58] Field of Search.................. 357/47, 48, 44, 49, 357/86

[56] References Cited
UNITED STATES PATENTS
3,795,846  3/1974  Ogawa et al. .......................... 357/49

*Primary Examiner*—Edward J. Wojciechowicz
*Attorney, Agent, or Firm*—Oblon, Fisher, Spivak, McClelland & Maier

[57] ABSTRACT

A composite type semiconductor is disclosed which comprises a semiconductor substrate having one conductive type. A plurality of semiconductor elements are formed by selective diffusion on a first main surface of the semiconductor substrate. An isolating diffused region for isolating and insulating the semiconductor elements is provided and the region is formed between the semiconductor elements by selectively diffusing impurities to impart an opposite conductive type to the substrate. An electrode metal layer which is adhered on a second main surface of the semiconductor substrate commonly connects each end of the semiconductor elements.

A process for preparing a composite type semiconductor is disclosed which comprises forming an isolating diffused region for isolating and insulating a semiconductor substrate to provide a plurality of regions by selectively diffusing impurities for imparting an opposite conductive type to that of the substrate, forming a plurality of semiconductor elements by selectively diffusing a specific impurity from the first main surface in the plurality of the isolated and insulated regions, forming an electrode metal layer connecting commonly each end of the plurality of the semiconductor elements, on the second main surface, and forming a plurality of electrodes corresponding to each of the semiconductor elements, on the first main surface of the semiconductor substrate.

1 Claim, 10 Drawing Figures

COMPOSITE TYPE SEMICONDUCTOR AND PREPARATION THEREOF

BACKGROUND OF THE INVENTION

1. Field of the Invention

The present invention relates to a composite type semiconductor such as a composite type diode in which the anodes or cathodes thereof are commonly connected.

2. Description of the Prior Art

The conventional center tap composite type diode is usually prepared by using diode pellet elements. For example, two diodes are soldered on one metal substrate.

In this case, it is necessary to find the polarity of the diode pellets before soldering the diode pellets on the substrate and it is necessary to provide sufficient space between the pellets so as to enable soldering of them during a soldering operation.

Accordingly, a problem with the conventional composite type diode is that a large space and a large metal substrate are disadvantageously required whereby a compact product cannot be prepared.

In order to overcome these disadvantages, a composite type diode having a plurality of diode elements on one semiconductor substrate has been developed.

FIG. 1 is a sectional view of one embodiment of the conventional composite type diode wherein two P type layers 12 and 13 are formed on the N type silicon single crystal substrate 14 to therefore form a pair of diode elements which are commonly connected to the cathode. However, when the conventional composite type diode is connected in the circuit of FIG. 2 to form a closed circuit which includes a DC power source 15, PN junction 16 at one end of the composite diode, a variable resistance 17 and (a) point 18 and a current $I_1$ is passed through the closed circuit, a reverse current $I_2$ is passed from the PN junction 16 to another PN junction 19 and the (a) point 18, certain undesirable effects occur. The value of the variable resistance 17 is changed to change the current $I_1$ and the current $I_2$ is measured. The relation of $I_1$ and $I_2$ is shown in FIG. 3, wherein the ordinate is the reverse current $I_2$ passing through the junction 19 and the abscissa is the forward current $I_1$ passing through the junction 18. When a forward voltage is applied to the junction 16 to pass the forward current $I_1$, the reverse current $I_2$ is changed in proportion to the forward current $I_1$ and is passed through the junction 19 such as to result in interference between the diode having the P type layer 12 and the N type layer 14 and the diode having the P type layer 13 and the N type layer 14.

Accordingly, it is seen that the electrical characteristics obtained using the conventional composite type diode shown in FIG. 1 are undesirable and not practical in use.

SUMMARY OF THE INVENTION

Accordingly, it is an object of the present invention to provide a new and improved unique composite type semiconductor which is compacted by forming a plurality of semiconductor elements which are commonly connected to one semiconductor substrate.

Another object of the subject invention is to provide a new and improved unique composite type semiconductor which has desirable electrical charcteristics by effectively preventing electrical interference between the semiconductor elements formed on a single semiconductor substrate.

Yet one other object of this invention is to provide a new and improved unique process for preparing a composite type semiconductor with high efficiency.

Briefly, the foregoing and other objects of the invention have been attained by providing a composite type semiconductor which comprises a semiconductor substrate having one conductive type. A plurality of semiconductor elements are formed by selective diffusion on a first main surface of the semiconductor substrate. An isolating diffused region for isolating and insulating the semiconductor elements is provided and the region is formed between the semiconductor elements by selectively diffusing impurities to impart an opposite conductive type to the substrate. An electrode metal layer which is adhered on a second main surface of the semiconductor substrate commonly connects each end of the semiconductor elements. The present invention is also to provide a process for preparing a composite type semiconductor which comprises forming an isolating diffused region for isolating and insulating a semiconductor substrate to provide a plurality of regions by selectively diffusing impurities for imparting an opposite conductive type to that of the substrate, forming a plurality of semiconductor elements by selectively diffusing a specific impurity from the first main surface in the plurality of isolated and insulated regions, forming an electrode metal layer connecting commonly each end of the plurality of the semiconductor elements on the second main surface, and forming a plurality of electrodes corresponding to each of the semiconductor elements, on the first main surface of the semiconductor substrate.

BRIEF DESCRIPTION OF THE DRAWINGS

A more complete appreciation of the invention and many of the attendant advantages thereof will become readily apparent as the same becomes better understood by reference to the following detailed description when considered in connection with the accompanying drawings, wherein.

DETAILED DESCRIPTION OF THE PREFERRED EMBODIMENT

Figure 5:
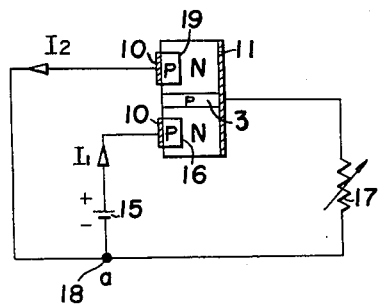
FIG. 5 is an electrical circuit diagram using the composite type diode of the present invention.
Figure 6:
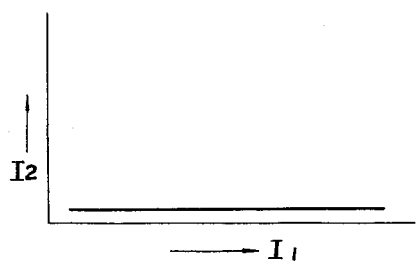
FIG. 6 is a characteristic graph for illustrating interference between the diode elements in the circuit of FIG. 5.

Referring now to the drawings, wherein like reference numerals refer to or designate identical or corresponding parts throughout the several views, and more particularly to FIGS. 4, 5 and 6 thereof, wherein a center tap composite type diode whose cathodes are commonly connected in accordance with the present invention is illustrated.

Figure 4A:
FIGS. 4(A), 4(B), 4(C), 4(D) and 4(E) are respectively sectional views for illustrating the steps of the preparation of the composite type diode of the present invention.
Figure 4B:
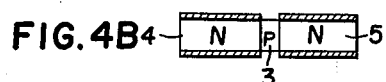

In FIG. 4(A), the reference numeral 1 designates a semiconductor substrate, e.g. an N type silicon single crystal substrate; 2 designates an insulation membrane, e.g. a silicon oxidized membrane which is formed on a first and a second main surface of the N type silicon single crystal substrate 1. When the N type silicon single crystal substrate 1 is masked with the known silicon oxidized membrane 2, a P type impurity, e.g. boron can be diffused from both surfaces by the selective diffusion method. In this manner, the N type silicon single crystal substrate 1 is isolated into two N type layers 4 and 5 by a P type isolating diffused region 3 as shown in FIG. 4(B). The isolating diffusion is carried out at both of the surfaces of the substrate 1 so as to form the P type isolating diffusion region 3 for a short time.

Figure 4C:
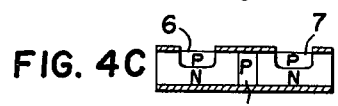

As shown in FIG. 4(C), the P type layers 6 and 7 which are anodes, can be formed on the N type layers 4 and 5 and isolated by the P type isolating diffusion region 3 by the selective diffusion method under masking of the silicon oxidized membrane.

Figure 4D:
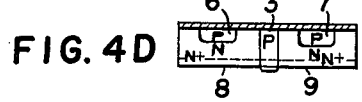

Thus, as shown in FIG. 4(D), $N^+$ layers 8 and 9 are formed on the opposite surface of the silicon substrate (opposite to the surface of the P type diffusion layers 6 and 7) by the selective diffusion of e.g. phosphorus.

Figure 4E:
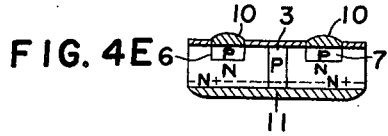

As shown in FIG. 4(E), electrodes 10 and 11 made of e.g. aluminum or gold are formed on the P type diffusion layers 6 and 7 and the $N^+$ layers 8 and 9 e.g. by the metal deposition method or the photographic printing method, whereby a center tap composite type diode having a common cathode is provided.

Figure 1:
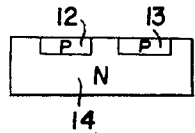
FIG. 1 is a sectional view of one embodiment of a conventional composite type diode.
Figure 2:
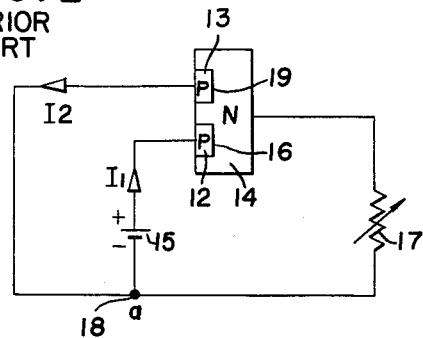
FIG. 2 is an electrical circuit diagram using the conventional composite type diode of FIG. 1.
Figure 3:
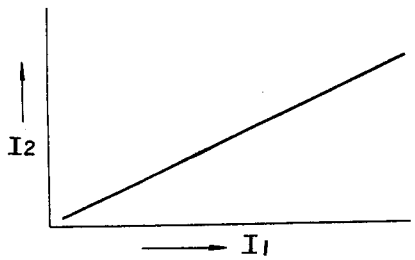
FIG. 3 is a characteristic graph for illustrating interference between the diode elements in the circuit of FIG. 2.

When the composite diode having a pellet structure such as shown in FIG. 4(E) is used, instead of the composite diode of FIG. 1, in the closed circuit of FIG. 5 which includes the DC power source 15, the PN junction 16 on one side of the composite diode, the variable resistance 17, the (a) point 18 and the current $I_1$ is passed through the closed circuit and the value of the current $I_1$ is changed, then the reverse current $I_2$ passing through the other PN junction 19 is not substantially changed.

FIG. 6 shows the relation of the current $I_1$ and the reverse current $I_2$, wherein the ordinate is the reverse current $I_2$ passing through the junction 19 and the abscissa is the forward current $I_1$ passing through the junction 16.

When a forward voltage is applied to the junction 16 to pass the forward current $I_1$, only a constant small current is passed through the junction 19 without affection of the forward current and no interference between the diode elements occurs.

Accordingly, in accordance with the formation of the isolating diffused region 3 between the diode elements, the electrical interference between the diode elements in the conventional composite type diode, can be effectively prevented.

In the preferred embodiment, a composite type diode having two diode elements whose cathodes are commonly connected, has been illustrated. However, it is clear that the invention can be applied to a composite type diode having common anodes. It is also possible with the present invention to provide composite type semiconductors having more than two semiconductor elements.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A composite type semiconductor comprising:
    a semiconductor substrate of a first conductivity type having first and second opposed main surfaces along the length thereof,
    an isolating region of a second and opposite conductivity type extending throughout the entire width of the semiconductor substrate and bisecting the semiconductor substrate to form first and second portions,
    a first semiconductor element of the second conductivity type disposed in the first portion of the semiconductor substrate along the first main surface of the semiconductor substrate,
    a second semiconductor element of the second conductivity type disposed in the second portion of the semiconductor substrate along the first main surface of the semiconductor substrate,
    a first main electrode connected to the first semiconductor element,
    a second main electrode connected to the second semiconductor element, and
    a third main electrode disposed along the second main surface of the semiconductor substrate to commonly connect the isolating region, the first portion of the semiconductor substrate and the second portion of the semiconductor substrate.

* * * * *